United States Patent [19]
Hanley et al.

[11] Patent Number: 5,225,024
[45] Date of Patent: Jul. 6, 1993

[54] MAGNETICALLY ENHANCED PLASMA REACTOR SYSTEM FOR SEMICONDUCTOR PROCESSING

[75] Inventors: Peter R. Hanley, Danville; Stephen E. Savas, San Jose; Karl B. Levy, Saratoga; Neeta Jha, Santa Clara; Kevin Donohoe, Mountain View, all of Calif.

[73] Assignee: Applied Materials, Inc., Santa Clara, Calif.

[21] Appl. No.: 750,720

[22] Filed: Aug. 22, 1991

Related U.S. Application Data

[63] Continuation of Ser. No. 349,010, May 8, 1989, abandoned.

[51] Int. Cl.$^5$ .............................................. H01L 21/00
[52] U.S. Cl. .................................. 156/345; 118/723; 204/298.16; 204/298.37
[58] Field of Search ........................ 156/345, 643, 646; 204/192.12, 192.32, 298.37, 298.16, 298.17; 118/723

[56] References Cited

U.S. PATENT DOCUMENTS

| | | | |
|---|---|---|---|
| 4,526,643 | 7/1985 | Okano et al. | 156/345 |
| 4,609,428 | 9/1986 | Fujimura | 156/643 |
| 4,623,417 | 11/1986 | Spencer et al. | 156/345 |
| 4,632,719 | 12/1986 | Chow et al. | 156/345 |
| 4,721,553 | 1/1988 | Saito et al. | 204/192.12 |
| 4,761,219 | 8/1988 | Sasaki et al. | 156/345 |
| 4,776,918 | 10/1988 | Otsubo et al. | 156/345 |
| 4,891,095 | 1/1990 | Ishida et al. | 156/345 |

FOREIGN PATENT DOCUMENTS 275021 7/1988 European Pat. Off. .
343500 11/1989 European Pat. Off. .

OTHER PUBLICATIONS

IBM Technical Disclosure Bulletin vol. 26 No. 2, Jul., 1983.

*Primary Examiner*—Thi Dang
*Attorney, Agent, or Firm*—Birgit E. Morris

[57] ABSTRACT

Magnetic confinement of electrons in a plasma reactor is effected using electro-magnetic coils and other magnets which generate respective magnetic fields which are mutually opposed and substantially orthogonal on their common axis to the major plane of a wafer being processed, instead of being aligned and parallel to the major plane as in prior magnetically enhanced plasma reactors. The respective magnetic fields combine to yield a net magnetic field which is nearly parallel to the wafer away from the magnetic axis so that electrons are confined in the usual manner. In addition, a magnetic mirror provides confinement near the magnetic axis. The E×B cross product defines a circumferential drift velocity urging electrons about a closed path about the magnetic axis. The magnetic and cross-product forces on plasma electrons have a rotational symmetry which enhances reaction uniformity across the wafer; this contrasts with the prior art in which lateral drift velocity disturbs plasma symmetry and thus reaction uniformity. Furthermore, the disclosed field geometry permits stronger electron confinement which enhances plasma reaction rates.

9 Claims, 3 Drawing Sheets

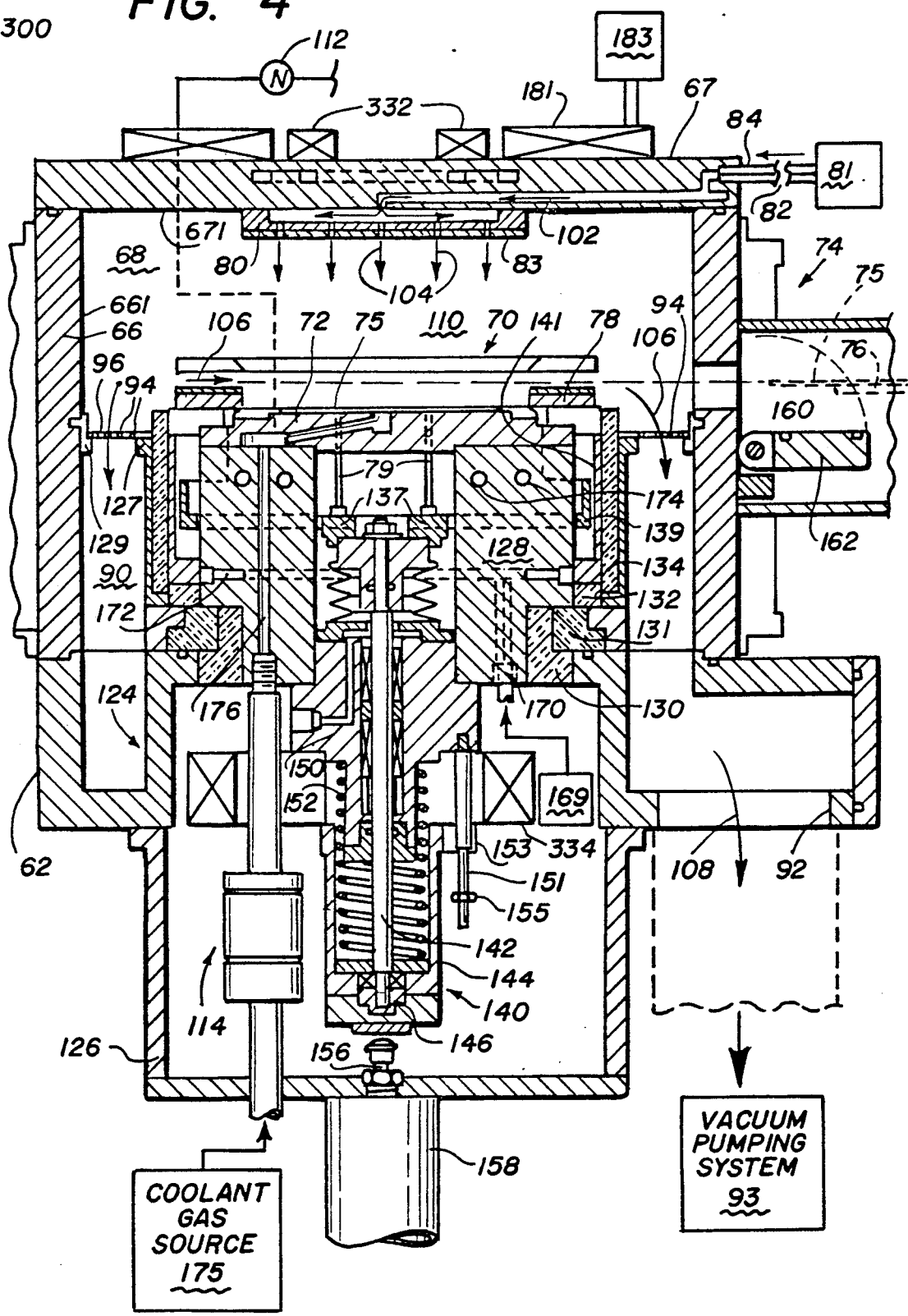

MAGNETICALLY ENHANCED PLASMA REACTOR SYSTEM FOR SEMICONDUCTOR PROCESSING

This is a continuation of U.S. application Ser. No. 07/349,010 filed May 8, 1989, now abandoned.

BACKGROUND OF THE INVENTION

The present invention relates to semiconductor processing and, more particularly, to a system and method which provide for efficient plasma production in a region directly above a semiconductor wafer. A major objective of the present invention is to provide for confinement of energetic electrons near the wafer with increased symmetry to enhance plasma and reactive natural species production and, thereby, enhance uniformity and rate of etching and deposition across a wafer.

Much of recent technological progress is identified with increasingly miniature integrated circuits which have been providing greater functional density at lower costs. Semiconductor processing technology has provided for increased functionality, in part, by permitting smaller features to be patterned onto a semiconductor wafer, and has provided for lower costs, in part, by developing equipment which can handle larger wafers, thereby increasing the number of circuits that can be made together. The 1980s have witnessed a rapid progression from 3-inch wafers with 3-micron features to 8-inch wafers with half micron features, and from 16-kilobit memories to one- and four-megabit memories, with 16- and 64-megabit memories in development.

Semiconductor processing typically involves a series of photolithographic procedures in which: 1) a layer of material is deposited or grown on a wafer, 2) a layer of photoresist is deposited over the material; 3) the photoresist is exposed to radiation according to a predetermined pattern defined by a mask or stepper program; 4) developer is used to remove resist, with either the exposed or unexposed resist being left in place; 5) the wafer is etched so that exposed material is removed, while material beneath the resist is retained; and 6) the remaining resist is removed to expose the patterned layer of material.

The trends of smaller features and larger wafers combine to make deposition and etch uniformity both more important and more difficult to achieve. Attainment of small features requires that photolithographic procedures be applied to very thin layers. This means that depositions and etches must be precisely controlled. Some approaches which were effective with larger feature sizes are becoming less applicable for submicron feature sizes. For example, wet chemical etches tend to be isotropic so that they etch laterally into material which is supposed to be protected by photoresist, requiring feature tolerances to be imposed. Furthermore, the surface tension associated with wet chemical etches impairs their conformance to small openings needed to define small features at the wafer surfaces exposed below the photoresist.

Plasma-based reactions have become increasingly important, providing for precisely controlled thin-film depositions and etches. A plasma is a mixture of positive and negative ions and electrons which is typically characterized by a visible glow. A plasma can be formed by capacitively coupling electric energy at radio frequencies, via a metal cathode, into electrons which can then impact gas molecules, creating more ions and free electrons. The positive ions are pushed outward by mutual repulsion toward surfaces including the cathode used in generating the electric field. Thus, a wafer supported over the cathode will be bombarded by positive ions which can form a deposited layer or cause a material to be etched, depending on the composition of the plasma.

Since the cathode has a large negative potential in a thin sheath region above and adjacent to the wafer surface, ions are accelerated so that they impact the wafer with large velocity components perpendicular to the plane of the wafer. These ions then bombard areas of material exposed due to the absence of photoresist and provide a high reaction rate on horizontal wafer surfaces with minimal effect on vertical sidewall features. Thus, plasma reactions are particularly well suited for precise pattern definition of small features.

Electrons have a charge equal in magnitude to that of the positive ions while being thousands of times lighter. Without some form of confinement, the more energetic electrons would diffuse away from the wafer, depleting the plasma of electrons capable of sustaining it and, thus, rendering it less dense immediately above the wafer. This diminished density results in a slower etch or deposition. The effect of electron depletion is apparent in the sheath over the wafer surface from which electrons are repelled. This sheath lacks the glow of the nearby plasma and is commonly referred to as a "dark space".

Energetic electrons can be confined to the plasma using a magnetic field which is parallel to the wafer surface. Electrons can be considered as being pulled into orbit about magnetic field lines so as to prevent their escape in a direction perpendicular to the magnetic field. A magnetic field along a wafer surface can be established using a pair of electro-magnets disposed on opposite sides of the wafer and arranged coaxially and parallel to each other so that their mutual axis extends parallel to the wafer surface. The magnetic fields generated by the coils are aligned so that they add to produce a field which is generally parallel to the wafer surface and uniform along the mutual axis.

The magnetic field B confines energetic electrons by forcing them into helical orbits about magnetic field lines. An electron in orbit about a magnet field parallel to and above a wafer progresses along a spiral from West to up to East to down. An electric field accelerates electrons in a direction opposed to the electric field, so that the downward electric field above a wafer in a conventional reactor system accelerates electrons in an upward direction.

An electron at the Western extreme of its orbit is traveling upward so that its speed is increased by the electric field. While at the top extreme of its orbit, the electron has acquired its maximum speed and is traveling in an Eastward direction. While at the Eastern extreme of its orbit, an electron undergoes a decrease in speed since its motion is aligned with the electric field. Minimum speed is reached at the bottom extreme of the orbit when the electron is traveling Westward. Thus, an orbiting electron travels fast Eastwardly and slow Westwardly.

The net effect is an Eastward E×B drift of the electron. Cumulatively, the energetic electrons, and thus the plasma they sustain, are subject to this Eastwind drift. This drift results in a plasma which is shifted Eastward relative to the wafer rather than being centered over it. This shift is a potential source of non-uniform depositions and etches.

There are various ways of dealing with this plasma shift. Electrons can be allowed to drift around an electrode to form a closed loop which goes under the wafer and then returns to the plasma region over the wafer. This requires a reaction vessel design in which the electric and magnetic fields all around the wafer support permit the required closed loop motion.

A time-averaged cylindrical symmetry can be achieved by rotating the wafer within the fields. However, rotating the wafer induces undesirable mechanical motion in the plasma, which can increase contamination. This mechanical motion can be avoided by rotating the magnetic field rather than the wafer, which can be done using two pairs of coils and phasing the currents though the coils so that the vector sum of the magnetic fields rotates in the plane parallel to the wafer surface. While excellent results have been achieved in such a system, the costs involved with the additional coils and current modulations make it less desirable. In addition, optimal uniformity on the largest wafers is more difficult to attain with coils of finite size in this configuration.

What is needed is a system and method for confining electrons to the desired region which avoids the problems associated with plasma shift. Preferably, plasma shift should be avoided even on an instantaneous basis so that time-averaging need not be relied on.

SUMMARY OF THE INVENTION

The present invention uses an axi-symmetric magnetic field with its axis perpendicular to the wafer for electron confinement. The magnetic field is axial along the axis; away from the axis, magnetic fields lines extend radially and become increasingly parallel to the wafer. Energetic electrons distant from the axis are confined by being pulled into orbit around magnetic field lines which are generally parallel to the wafer, as in a conventional magnetic confinement approach. The magnetic field becomes stronger at larger distances above the wafer so that energetic electrons near the axis are confined by a magnetic mirror region of the field. Energetic electrons at intermediate radial positions above the wafer are confined by intermediate levels of each confinement effect so that substantially uniform electron confinement is provided over the entire wafer.

Magnetic mirrors have been described in the context of plasma confinement in fusion reactors. An electron progressively spiralling along a magnetic field line has a velocity component parallel to the field line and another velocity component perpendicular to the field line. Where the field strength increases in the direction of electron travel, the perpendicular velocity component increases to conserve magnetic moment. Conservation of energy then requires that the parallel component be correspondingly diminished. When the perpendicular velocity component corresponds to the total electron energy, the parallel component reverses to conserve energy. This reversal is characterizable as a reflection in a magnetic mirror. In the geometry defined by the present invention, the magnetic mirror is axi-symmetric and coaxial with its magnetic field so that energetic electrons moving up and away from the wafer are reflected back toward the wafer by the magnetic mirror. Reference is made to a magnetic mirror region, since the mirror has depth and since its effects decrease gradually radially away from its axis so that its boundary is indistinct.

The axi-symmetric magnetic field can be established using two coils which are positioned with their axes coinciding. Accordingly, the coils are arranged parallel to the wafer, rather than perpendicular to the wafer as in conventional magnetically enhanced plasma etching and deposition reactors. Furthermore, the fields produced by the coils are opposed, rather than aligned as in conventional plasma reactors. Preferably, where the surface to be patterned is facing upward, the magnetic field produced by the coil above the wafer surface of interest dominates in the region of the plasma to produce the desired small axial component near the wafer. A small permanent magnet can be disposed near the wafer and arranged coaxially with the coils to enhance the magnetic field gradient and strengthen the magnetic mirror, thus enhancing the resulting etch or deposition rate.

A major advantage of the present invention is that the $E \times B$ drift is azimuthal about the axis of symmetry, both near to and away from the magnetic axis. Thus, electrons tend to drift along a circular path above the wafer without inducing any plasma shift. The axis of symmetry is an axis of rotational symmetry for all three forces which act on the electrons, i.e., electric field forces (which are generally axial), magnetic field forces (which are generally axial and radial), and $E \times B$ forces which are generally circumferential. "Axi-symmetric" denotes this rotational symmetry, which represents a high level of symmetry characterized by a 360° continuum of symmetries.

The azimuthal drift and rotational symmetry provided by the present invention contrast with the lateral drift and lack of simple symmetry in the conventional magnetic confinement arrangement. As a result, there is no need for temporal averaging or the provision for a drift path which leads electrons under the wafer.

The present invention further provides considerable flexibility in controlling the magnetic field shape using different numbers, sizes and locations of magnets, which can include permanent magnets and electro-magnets with a range of strengths. Magnets at different distances above and below the wafer and with different radii can be used to improve the strength and uniformity of the magnetic confinement. By confining electrons near the sheath, movement of the sheath boundary can impart energy to an electron several times in a single half cycle of the oscillating electric field, enhancing plasma production and improving etching and deposition rates. These and other features and advantages of the present invention are apparent from the description below with reference to the following drawings.

BRIEF DESCRIPTION OF THE DRAWINGS

FIG. 4 is a vertical cross section of the plasma reactor of FIG. 3.

DESCRIPTION OF THE PREFERRED EMBODIMENTS

Figure 1:
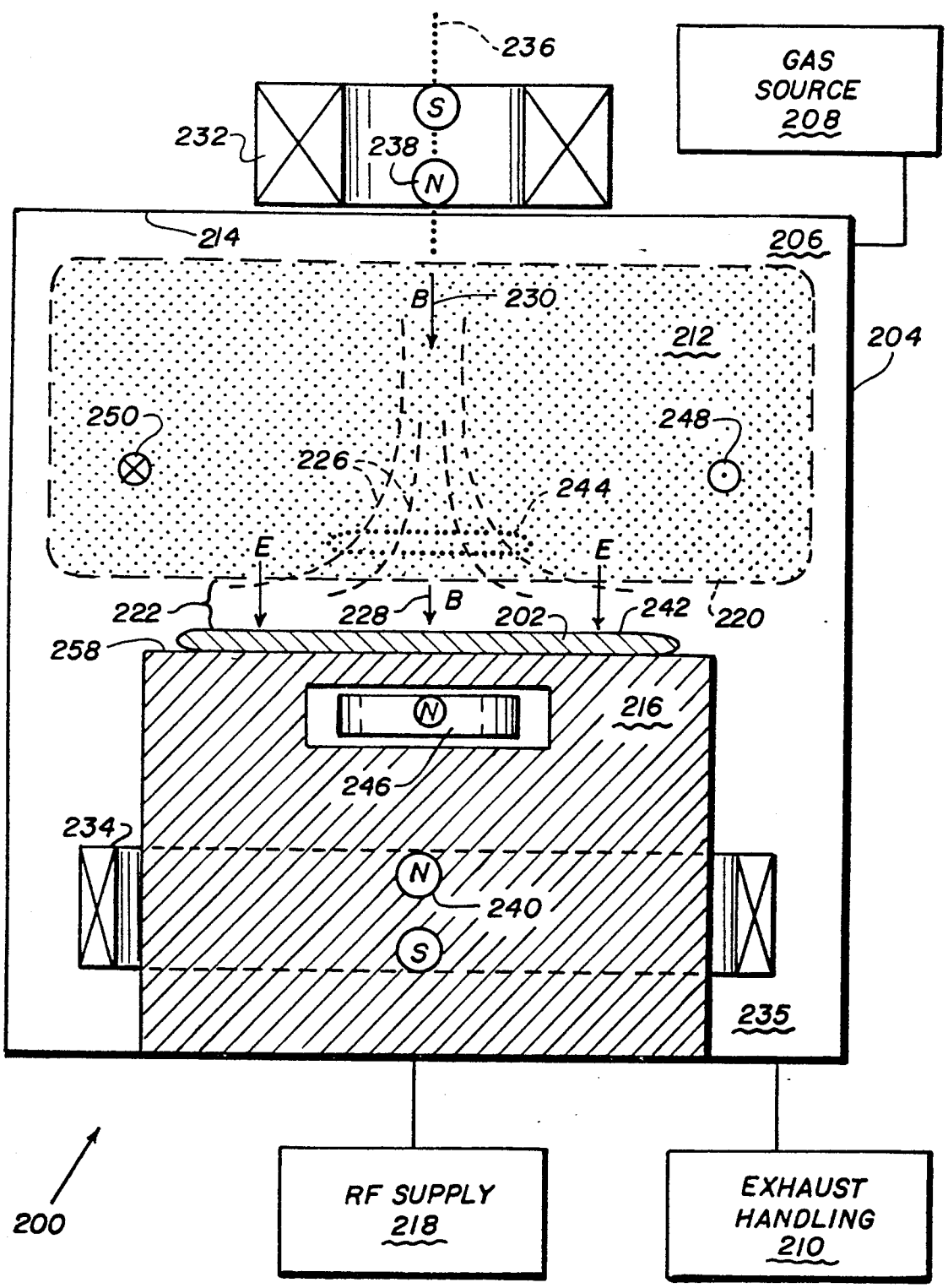
FIG. 1 is a schematic elevational view of a plasma reactor for semiconductor processing in accordance with the present invention.

In accordance with the present invention, a plasma reactor 200, suitable for reactive-ion etching of a wafer 202, comprises a cylindrical vessel 204 defining a reaction chamber 206, a gas source 208, and an exhaust handling system 210, as shown in FIG. 1. Gas source 208 provides reactant gas into chamber 206, while exhaust handling system 210 evacuates spent gases and maintains a desired sub-ambient (<1 Torr) pressure within chamber 206. A plasma 212 is generated within chamber 204 by an oscillating electric field E between an anode 214, which is the inner surface of vessel 204, and a cathode 216. The oscillations are provided by radio frequency power from an impedance-matched radio-frequency power supply 218. This causes an oscillating electric field in the glow region, and causes a sheath boundary 220 of plasma 212 with sheath 222 to oscillate up and down.

Electrons are magnetically confined within plasma 212 due to a combined magnetic field B which is characterized by diverging magnetic field lines 226 and axial field lines 228 and 230. Magnetic field B is the vector sum of magnetic fields produced primarily by an upper solenoidal electro-magnet 232 located at the top exterior of vessel 204 and a lower solenoidal electro-magnet 234 located underneath the wafer in an exhaust manifold 235 of vessel 204. Electro-magnets 232 and 234 are coaxial, sharing an axis 236 which is orthogonal to wafer 202.

The north pole 238 of upper electro-magnet 232 is directed downward toward wafer 202, and the north pole 240 of lower electro-magnet 234 is directed upward toward wafer 202. Accordingly, the axial components of the magnetic fields respectively generated by electro-magnets 232 and 234 are opposed and therefore subtract, while their radial components add. The field of upper electro-magnet 232 slightly dominates the field of lower electro-magnet 234 near sheath 222 so that axial components are weak and magnetic field lines 226 are nearly parallel to the major planar surface 242 of wafer 102 away from axis 236. Confinement of electrons remote from axis 236 thus is effected in a manner similar to confinement of electrons in reactor systems with the magnetic axis parallel to the wafer.

Near magnetic field axis 236 and near wafer 202, combined magnetic field B is nearly axial and is weak, as indicated by the short length of arrow 228. The combined magnetic field strength increases rapidly with distance above wafer 202, as indicated by arrow 230. The magnitude of the magnetic field gradient is sufficient to define a magnetic mirror region 244 within plasma 212 near sheath 222. Magnetic mirror region 244 reflects electrons from plasma 212 which would otherwise diffuse away. Thus, magnetic mirror region 244 provides electron confinement above wafer 202 near axis 236, while radial magnetic field lines 226 provide electron confinement away from axis 236. A permanent magnet 246, disposed within cathode 216, increases the strength of magnetic mirror region 244 and radial field lines 226 near axis 236 to enhance the etch rate of reactor 200.

The E×B drift velocity imparted to electrons in plasma 212 is azimuthal as indicated by out-of-the-page arrow 248 and into-the-page arrow 250. The drift velocity urges electrons about a circular path above the wafer. This does not induce an instantaneous asymmetry within plasma 212 and, therefore, etching is more uniform.

Figure 2:
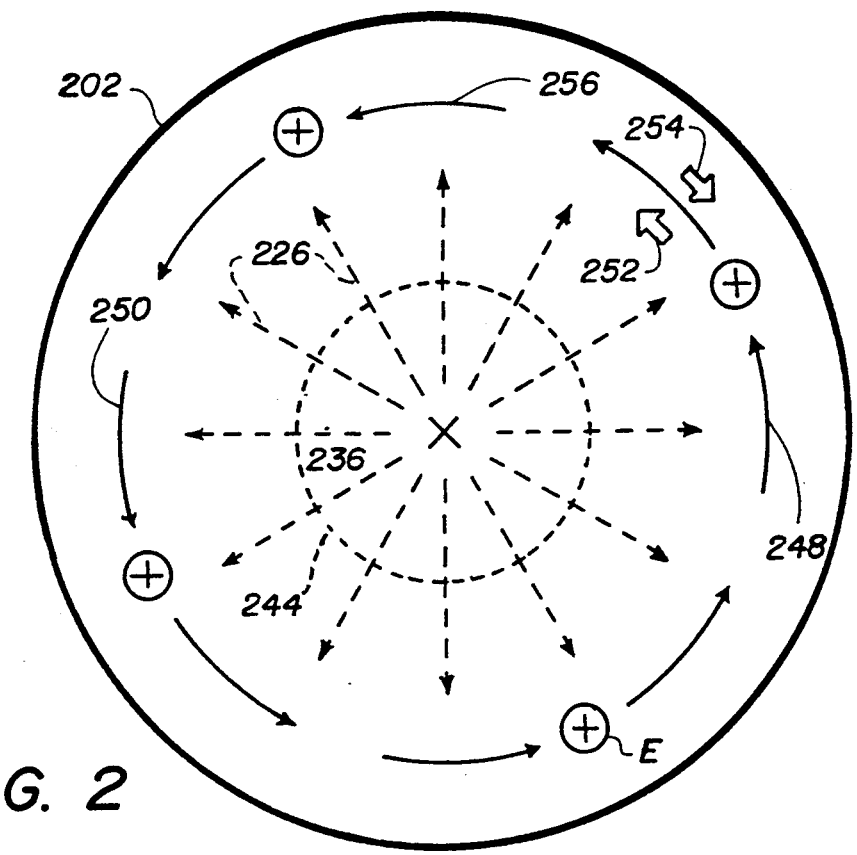
FIG. 2 is a schematic plan representation of the electric and magnetic forces generated by the reactor of FIG. 1.

The electro-magnetics of reactor system 200 is shown schematically from a top view in FIG. 2, in which wafer 202 is the major structural feature. The opposing magnetic fields of electro-magnets 232 and 234 are produced using opposing currents 252 and 254. The rotational symmetry about axis 236 of the combined magnetic field B is apparent from radial magnetic field lines 226 and magnetic mirror region 244, the boundary of which is indicated by a dashed circle. The circumferential direction of the E×B drift velocity is depicted by arrows 248, 250 and 256. Near axis 236, the E and B fields are generally aligned so that their cross product is near zero and drift velocity is small.

Preferably, combined magnetic field B is generated so that the peak plasma density is nearer sheath 222 than to the top of chamber 206, FIG. 1. To accomplish this, a high percentage of electrons which have been energized by sheath boundary 220 are confined to a region near sheath 222. In the illustrated plasma reactor 200, vessel 204 has a 13" inner diameter. Lower electro-magnet 232 has an outer diameter of 11.5", an inner diameter of 10.25", and a height of 2". Cathode 216 has an outer diameter of 10". Upper electro-magnet 232 has an outer diameter of 6", an inner diameter of 3", and a height of 1.25". Permanent magnet 246 is of barium ferrite, a ceramic, provides a field strength between 35 and 100 Gauss, and is located about 0.75" below an upper surface 258 of cathode 218.

Figure 3:
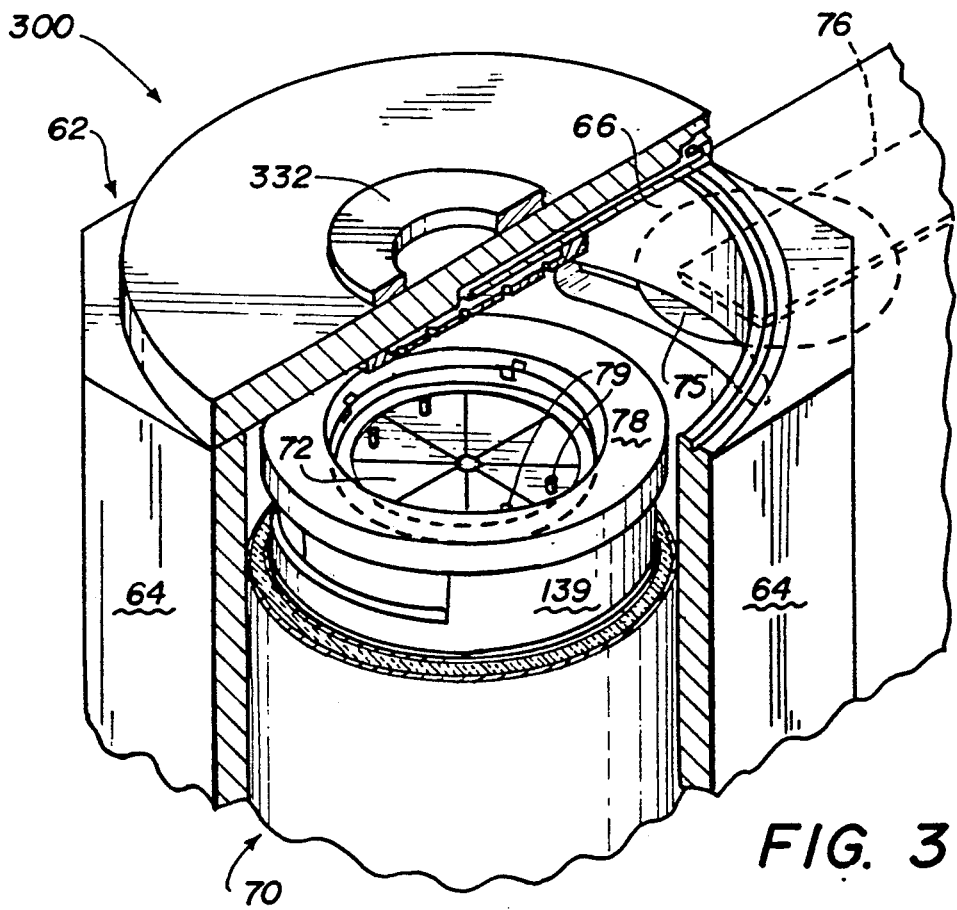
FIG. 3 is a perspective view with cutaways of another plasma reactor in accordance with the present invention.

A second reactor 300 in accordance with the present invention is depicted in FIGS. 3 and 4. Reactor system 300 is a single wafer, magnetic field-enhanced plasma etch reactor primarily used for RIE mode plasma etching, but capable of plasma mode etching as well. Reactor system 300 comprises a housing 62, typically of non-magnetic material such as aluminum, which has an octagonal configuration of outer walls 64 (as viewed in horizontal cross-section). Circular inner wall 66 defines etch chamber 68. Magnetic coils 332 and 334 generate the desired axi-symmetric magnetic field and magnetic mirror region. No permanent magnet is used in reactor system 300. The reactor system 300 also includes a gas- and liquid-cooled pedestal/cathode assembly 70 and a wafer exchange system 74.

The wafer exchange system 74 includes vertically movable wafer lift fingers 79 which pick up wafer 75 from blade 76, and transfer wafer 75 to cathode 72 for processing, then return the processed wafer to robot blade 76 for removal from chamber 68. In addition, wafer exchange system 74 integrally incorporates a wafer clamp ring 78 with wafer lift fingers 79. The design of wafer exchange system 74 and the incorporation of the associated wafer lift and clamping structures permit the use of a one-axis robotic drive within chamber 68. Furthermore, the external robot need merely present wafer 75 to a selected transfer position for exchange with the chamber robot.

Process gases are supplied chamber 68 by a gas manifold 80 from a gas supply system 81 comprising one or more gas storage reservoir/tanks. Gas supply system 81 communicates to manifold 80 and chamber 68 via supply line(s) 82, which is coupled into the manifold 80 by inlet connection 84. Reactor 300 includes an automatic flow control system which controls the flow rates of the various etchant gases, carrier gases, etc., supplied to chamber 68.

Vacuum is established in chamber 68 and spent gases and entrained products are exhausted via an annular exhaust chamber 90 communicating to exhaust port 92 which, in turn, is connected to a conventional vacuum pumping system 93 comprising a mechanical pump (not shown), typically via a vacuum valve system and Roots blower, or other conventional components. The exhaust flow is directed from chamber 68 through holes 94 in a horizontal annular plate 96 mounted about the upper periphery of cylindrical cathode assembly 70. Apertured plate 96 inhibits plasma penetration into annular exhaust chamber 90. This exhaust arrangement facilitates uniform coverage and etching of wafer 75 by the reactant gas. Control of the exhaust system 93 is by a capacitive conventional system such as manometer sensor (not shown) which operates through a pressure control system and D.C. motor to control the speed of the blower.

As indicated by arrows 102–108 in FIG. 4, the gas communicated to inlet 84 (arrow 100) is routed into manifold 80 (arrow 102) and is then directed downwardly from manifold 80 (arrow 104), forming an etching gas plasma in chamber process region 110 during application of RF power, then flows over the wafer 75 and radially outwardly across wafer 75 and into annular exhaust chamber 60 (arrow 106), then out exhaust port 92 (arrow 108).

RF power is supplied by an RF electrical source 112 to create an etching gas plasma from the inlet gases in process region 110. Electrical source 112 includes an RF power supply and a load matching network, and is connected to cathode 72, with the chamber walls being at ground. That is, cathode 72 is the powered cathode. The RF power typically is supplied at a high frequency, preferably 13.6 MHz. However, reactor system 300 can be operated at low frequencies of, for example, several kHz. Alternatively, higher frequencies, e.g., several hundred MHz, can be used.

The use of a powered pedestal cathode provides the advantage of concentrating the RF power and plasma on the surface area of the wafer and increasing the power density across the wafer while reducing it everywhere else. This promotes etching at the wafer 75 in favor of in other parts of chamber 68, thus reducing possible wafer contamination. Typically, power densities of about 1–5 watts/cm are used.

These high power densities require cooling. Preferably, cathode 72 is constructed to combine gas-enhanced wafer-to-cathode thermal conductance and liquid cathode cooling. However, the application of cooling gas such as helium to cathode 72 at low pressure would ordinarily cause the cooling gas to break down. The present reactor includes a gas feed-through 114, that supplies the gas to cathode 72 without ionization.

Pedestal assembly 70 comprises a generally cylindrical wall structure 124 that is mounted inside the housing 62 and a cylindrical bottom housing 126 that is mounted to, and extends below, the bottom of housing 62. Annular exhaust plate 96 is mounted peripherally about housing 124 on bosses 127 and 129. Cathode 72 is mounted on a generally cylindrical base 128 that is mounted to the grounded housing by mating annular insulator members 130–134.

Wafer exchange assembly 70 includes a multiplicity of vertically-extending wafer support pins/fingers 79 (four are illustrated) arranged in a circular configuration. Fingers 79 extend through holes in the periphery of the cathode 72 and base 128. Wafer support fingers 79 and wafer clamping ring 78 are mounted to a support arm means, which comprises horizontally-extending arms 137 mounted to shaft lift mechanism 140 and cylindrical ring member 139. Arms 137 are mounted to shaft lift mechanism 140 for vertical displacement.

Wafer holding pins 79 are mounted on respective arms 137 of the arm assembly and extend through holes in the upper, wafer support face of the cathode 72. Wafer clamp ring 78 is also mounted to the arm assembly, that is, to a ring 139. Ring 139 is vertically movable within a channel 141 formed between housing 124 and base 128. The use of wafer support pins 79 and wafer clamping ring 78, which is displaced vertically from the pins, and their joint mounting to the common, vertically movable arm assembly provide simple wafer exchange with robot blade 76 using a single axis movement.

Shaft lift mechanism 140 comprises a sleeve 142 and a cylindrical spring retainer 144 that are joined by a bolt 146, and is slidably mounted on bearings 148 within a bore formed in base 150. Base 150 is of stepped cylindrical configuration, and is joined at the step or shoulder thereof to the bottom of base 128.

Lateral movement of shaft lift mechanism 140 is constrained by a pair of vertical guide pins 151 (only one is shown) which extend through an eyelet 153 of the shaft 140. An adjustable stop nut 155 is mounted on the threaded lower portion of pin 151 to limit the upward movement (uppermost position) of the shaft lift mechanism 140 and clamp ring 78 and pins 79.

A spring 152 is secured between the bottom of the base 150 and the shaft's spring retainer 144 to bias the shaft lift mechanism 140, clamp 78 and pins 79 downwardly to a normal, lower position. In this spring-biased position, pins 79 are retracted into their holes in cathode 72 and the clamp ring 78 resiliently engages the periphery of the cathode 72. Clamp ring 78 securely and resiliently clamps the periphery of wafer 75 against the upper surface 154 of cathode 72. Vertical upward movement of the shaft lift mechanism 140, clamp ring 78 and pins 79 is effected by vertical rod 156 of a pneumatic cylinder 158 which, typically, is mounted to housing 126. Upward movement of rod 156 moves the shaft 140 upward against the biasing action of the spring 152, disengaging clamp ring 78 from the cathode 72 and wafer 75 and extending fingers 79 upward through cathode 72 to pick up wafer 75.

Reactor housing wall 66 has a closable elongated opening or slot 160 which allows movement of external blade 76 in and out of chamber 68. Slot 160 is closed by a pivotally mounted door 162 to seal chamber 68 when blade 76 is not being used to deposit and withdraw wafers from chamber 68.

Pedestal assembly 70 is cooled by a combination of liquid and gas, i.e., by gas-enhanced wafer-to-cathode thermal conductance and by liquid cathode cooling. Liquid, typically in the form of cold water, is applied by a computer-controlled water supply 169 to an inlet 170 which communicates with a lower annular channel 172 in base 128 and also with a pair of upper circular channels 174.

The cooling gas is used to enhance heat transfer from wafer 75 to water-cooled cathode 72. The thermally conductive gas is applied by conventional computer-controlled coolant-gas supply 175 to inlet passageway 176 via feed-through 114 which prevents ionization of the low pressure gas by cathode 72.

A heating unit 181, a cylindrical electrical resistance heater, is mounted on cover 67 of reactor 300 for the purpose of heating the cover 67 and the upper portion of housing sidewalls 66-66, specifically, the inside housing and upper chamber walls 67I and 66I.

The present invention provides considerable design freedom in altering the foregoing specifications. Different plasma compositions can be used to promote different sets of etching or deposition reactions at a wafer surface. Different magnet positions, dimensions, currents, and field strengths are provided for. Upper magnets with larger inner and outer diameters have been successfully used. Magnets can be positioned inside of chamber 206 or external to vessel 208, or both. External magnets can be positioned above, below or about the circumference of vessel 204. Both permanent and electro-magnets can be used. The polarities of both the upper and lower magnets can be inverted relative to the polarities illustrated. Any number of magnets can be used to fine tune the radial profile of the plasma. This includes supplemental magnets of either polar orientation relative to the main magnets. These and other variations upon and modifications to the described embodiments are provided for by the present invention, the scope of which is limited only by the following claims.

What is claimed is:

1. A plasma etch or CVD reactor having a pair of electrodes for plasma processing comprising:
    plasma generation means for forming a plasma including energetic electrons near a major planar surface of a substrate mounted on a cathode, said plasma being selected to promote predetermined plasma processing at said surface; and
    magnetic confinement means for defining a cusp magnetic mirror region which at least partially confines said energetic electrons to a region near said major planar surface of said substrate and a permanent magnet disposed within said cathode to enhance said plasma processing.

2. A plasma reactor having a pair of electrodes for plasma processing comprising:
    substrate support means mounted on a cathode for supporting a substrate having a major planar surface at which plasma-based processing is to occur;
    plasma generation means for forming a plasma including energetic electrons near said major planar surface; and
    cusp magnetic mirror generation means for magnetically confining at least a portion of said energetic electrons proximate to said major planar surface, said mirror means defining a substantially axi-symmetric magnetic field with an axis substantially orthogonal to said major planar surface and a permanent magnet disposed within said substrate support.

3. A plasma reactor for semiconductor processing comprising:
    plasma generation means for forming a plasma including energetic electrons near a major planar surface of a semiconductor substrate mounted on a cathode, said plasma being selected to promote predetermined etch or CVD processing at said surface;
    plural magnetic means which develop a substantially timeinvariant cusp magnetic mirror region near said major planar surface, said plural magnetic means including a first magnet means and a second magnet means located on opposing sides of said substrate, said first magnet means providing a first magnetic field on a first side of said major planar surface having a first magnetic axis substantially orthogonal to said major planar surface, said second magnet means providing a second magnetic field on a second side of said major planar surface having a second magnetic axis substantially coaxial with said first magnetic axis; and a permanent magnet located within said cathode.

4. A plasma reactor for semiconductor processing comprising:
    a reaction vessel defining a CVD or etch plasma reaction chamber;
    gas introduction means for introducing a reactive plasma precursor gas into said reaction chamber;
    exhaust handling means for removing spent gases from said plasma reaction chamber and for maintaining a sub-ambient pressure within said chamber;
    support means for supporting a substrate mounted on a cathode within said plasma reaction chamber, said substrate having a major planar surface on which plasma processing is to occur;
    a permanent magnet disposed within said cathode;
    power source means for generating an oscillating electric field to generate a plasma from said plasma precursor gas, said electric field being generally orthogonal to said major planar surface so that positive ions of said plasma are attracted to said surface; and
    magnetic means for generating a substantially time-invariant net magnetic field which is at least partially symmetric about an axis orthogonal to said major planar surface, said net magnetic field being increasingly parallel to said surface at increasing radii from said axis, said magnet means including a first magnet means for generating a first magnetic field on a first side of said major planar surface having an axis substantially orthogonal to said surface and a second magnet means for generating a second magnet field on a second side of said major surface, said first magnetic field and said second magnetic field cooperating to confine at least a portion of energetic electrons proximate said major planar surface of said surface.

5. The plasma reactor of claim 4 wherein said plasma has a sheath boundary which moves back and forth across a boundary space under the influence of said plasma generation means, said first magnet means and said second magnet means being oriented so that said net magnetic field confines many of the more energetic electrons of said plasma to a region immediately above said boundary space.

6. The plasma reactor of claim 4 wherein said reaction vessel includes an exhaust manifold and wherein one of said first and second magnets means is at least partially positioned within said exhaust manifold.

7. A plasma reactor for semiconductor processing comprising:
    plasma generation means for forming a CVD or etch plasma including energetic electrons near a surface of a semiconductor substrate mounted on a cathode, said plasma being selected to promote predetermined processing at said surface, said plasma generation means including means for generating a radio frequency electric field;
    a permanent magnet disposed within said cathode; and
    confinement means for magnetically confining a substantial proportion of said energetic electrons of said plasma, said confinement means defining a magnetic field which cooperates with said electric field to induce plasma drift which is azimuthal about an axis substantially orthogonal to said surface.

8. A plasma reactor comprising:

a CVD or etch reaction chamber;

substrate support means mounted on a cathode within said reaction chamber for supporting a substrate having a major planar surface to be processed;

plasma generation means for generating a plasma proximate to said major planar surface;

a permanent magnet means disposed within said cathode;

first magnet means having a first magnetic axis, said first magnet means being disposed on a first side of said major planar surface such that said first magnetic axis is substantially perpendicular to said major planar surface; and second magnet means having a second magnetic axis, said second magnet means being disposed on a second side of said major planar surface such that said second magnetic axis is substantially perpendicular to said major planar surface, wherein said first magnet means and said second magnet means cooperate to generate a substantially time-invariant cusp magnetic mirror region proximate said major planar surface to at least partial confine energetic electrons proximate said major planar surface.

9. A plasma reactor as recited in claim 8 wherein said first magnetic axis and said second magnetic axis are substantially coaxial and ar substantially centered on said major plane of said semiconductor wafer.

* * * * *